United States Patent
Thurén (10) Patent No.: US 7,088,468 B1
(45) Date of Patent: Aug. 8, 2006

(54) DATA-CONVERSION METHOD FOR A MULTIBEAM LASER WRITER FOR VERY COMPLEX MICROLITHOGRAPHIC PATTERNS

(75) Inventor: Anders Thurén, Täby (SE)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 09/380,270

(22) PCT Filed: Feb. 26, 1998

(86) PCT No.: PCT/SE98/00347

§ 371 (c)(1),
(2), (4) Date: Aug. 27, 1999

(87) PCT Pub. No.: WO98/38597

PCT Pub. Date: Sep. 3, 1998

(30) Foreign Application Priority Data

Feb. 28, 1997 (SE) .................................. 9700742

(51) Int. Cl.
*G06K 15/12* (2006.01)
(52) U.S. Cl. .................. 358/1.7; 358/1.17; 358/1.4
(58) Field of Classification Search ............... 358/1.17, 358/1.7, 1.4, 1.3, 1.8; 347/225, 233, 237, 347/240, 247, 251
See application file for complete search history.

(56) References Cited

U.S. PATENT DOCUMENTS

| | | | | |
|---|---|---|---|---|
| 4,541,712 A | * | 9/1985 | Whitney ...................... | 355/53 |
| 5,533,170 A | | 7/1996 | Teitzel et al. | |
| 5,635,976 A | * | 6/1997 | Thuren et al. ............... | 347/253 |
| 5,701,405 A | * | 12/1997 | Kelley et al. ................ | 345/441 |
| 5,706,415 A | * | 1/1998 | Kelley et al. ................ | 345/426 |
| 5,980,088 A | * | 11/1999 | Iwasaki et al. ............. | 700/166 |
| 6,078,331 A | * | 6/2000 | Pulli et al. ................... | 345/423 |

FOREIGN PATENT DOCUMENTS

EP 0467076 1/1992

OTHER PUBLICATIONS

Proceedings of SPIE vol. 3997 (2000), Emerging Lithographic Technologies IV, "Lossless Layout Compression for Maskless Lithography Systems," Vito Dai et al.
Proceedings of SPIE vol. 4688 (2002), Emerging Lithographic Technologies IV, "Lossless Compression Techniques for Maskless Lithography Data," Vito Dai et al.

* cited by examiner

*Primary Examiner*—Joseph R. Pokrzywa
(74) *Attorney, Agent, or Firm*—Harness, Dickey & Pierce, P.L.C.

(57) ABSTRACT

The invention relates to microlithography, in particular to the writing of photomasks for computer displays, microelectronic devices, and precision photoetching. It is also applicable to wafers, optical devices and a variety of electronic interconnection structures such as multichip modules. Other applications are possible, such as printing and graphics, as well as laser projection displays. In the present invention the data conversion is divided in two steps: first cutting the geometries in scan lines and simplifying them, and then finishing the conversion of the scan lines at the point of demand, i.e. in a beam processor in the driving electronics for each beam. The idea is to make as much as possible of the conversion at the latest possible point, i.e. at the beams. What is needed at an earlier stage is to separate the data for different beams and distribute them, and to simplify the data enough to make sure that the beam processors can always handle the data flow.

19 Claims, 8 Drawing Sheets

DATA-CONVERSION METHOD FOR A MULTIBEAM LASER WRITER FOR VERY COMPLEX MICROLITHOGRAPHIC PATTERNS

This application is the national phase under 35 U.S.C. §371 of PCT International Application No. PCT/SE98/00347 which has an International filing date of Feb. 26, 1998 which designated the United States of America.

FIELD OF THE INVENTION

The invention relates to microlithography, in particular to the writing of photomasks for computer displays, microelectronic devices, and precision photoetching. It is also applicable to wafers, optical devices and a variety of electronic interconnection structures such as multichip modules. Other applications are possible, such as printing and graphics, as well as laser projection displays.

BACKGROUND OF THE INVENTION

The application discloses a method for data conversion at extremely high through-put in a multi-beam laser plotter. The need for such high capacity comes from two sources: the ever-increasing number of features on photomasks, and increasingly sophisticated designs. For both computer displays, consumer TV screens and microelectronic products there is a rapid development towards at the same time larger sizes and smaller elemental cells. The development is most dramatic with semiconductor memories where a photomask could contain a billion elemental geometries or more. Furthermore, the elemental geometries need not be rectangular, but could be of any shape.

The input data file may be in a compacted hierachical format, but during processing the data volume increases immensely (up to 1000–10 000 Gb per mask) and it is impossible to process the data beforehand and store the data until the time of writing. The datapath must therefore have enough processing capacity to convert the data in real time.

Another issue is the necessity of a small address grid. The writing system for semiconductor masks must be capable of writing features specified in units of 10 nm (nanometers) or less. It has been disclosed in European (nanometers) or less. It has been disclosed in European Patent EP 0 467 076 by the same inventor that a combination of time delays and analog power modulation can be used to achieve an arbitrarily small address grid. The same patent also discloses the use of several beams and parallel data paths to increase the through-put of the writing system.

For a writer with two laser beams two parallel data paths may be feasible, but current multibeam writers may use up to 32 beams and simple multiplication of a single-beam datapath would be practically impossible.

There is also a strong desire to have unequal numbers of processors and beams, in particular a much larger number of processors than beams. A second need is to make the system easily scaleable, so that writers for different applications with different requirements on capacity can be configured from standard modules and running identical software.

In United States patent U.S. Pat. No. 5,533,170 a high-throughput multibeam data path based on parallel rasterizers is disclosed. Each rasterizer, "geometry engine", converts a frame of the pattern to a pixel map where each pixel has a greyscale value from 0 to 16. The bitmaps are distributed to beam boards via a bus system and loaded into a buffer RAM area in each bus board.

The method in U.S. Pat. No. 5,533,170 requires very high processing power. In particular every pixel has to be filled with its proper value and transmitted to the beam boards for writing. This is done by signal processors and custom ASICs. The writing system has a burst pixel rate of 1600 million pixels per second, and extremely high demands are placed on the internal data paths. Therefore a system with parallel buses is used and the result is a complex, costly and inflexible system.

The present invention devices a method for data conversion that can be used on configurations from one beam/one processor to tens of beams/hundreds of processors.

BRIEF SUMMARY OF THE INVENTION

In the present invention the data conversion is divided in two steps: first cutting the geometries in scan lines and simplifying them, and then finishing the conversion of the scan lines at the point of demand, i.e. in a beam processor in the driving electronics for each beam. The idea is to make as much as possible of the conversion at the latest possible point, i.e. at the beams. What is needed at an earlier stage is to separate the data for different beams and distribute them, and to simplify the data enough to make sure that the beam processors can always handle the data flow.

There are benefits with the invention in three areas:

there is nowhere in the system a pixel map that has to be filled, therefore a lot of processing power is saved keeping the information to the beam processors in geometrical form instead of as a pixel map gives a smaller data volume, making the implementation simpler and more flexible. Practical tests indicate savings of 4–20 times depending on the pattern.

the manipulation of the geometrical data without filling operations is well suited for algorithmic programs running on a general-purpose processor, while the final processing in the beam boards is better served with custom-logic. Using general purpose processors gives great flexibility. It is possible to increase the performance simply by moving to faster processors as they become available, and it is easy to modify or refine the algorithms to follow the needs of the applications. Custom algorithms for specific applications or new input formats are easily implemented.

FUNCTION OF THE INVENTION

Figure 1A:
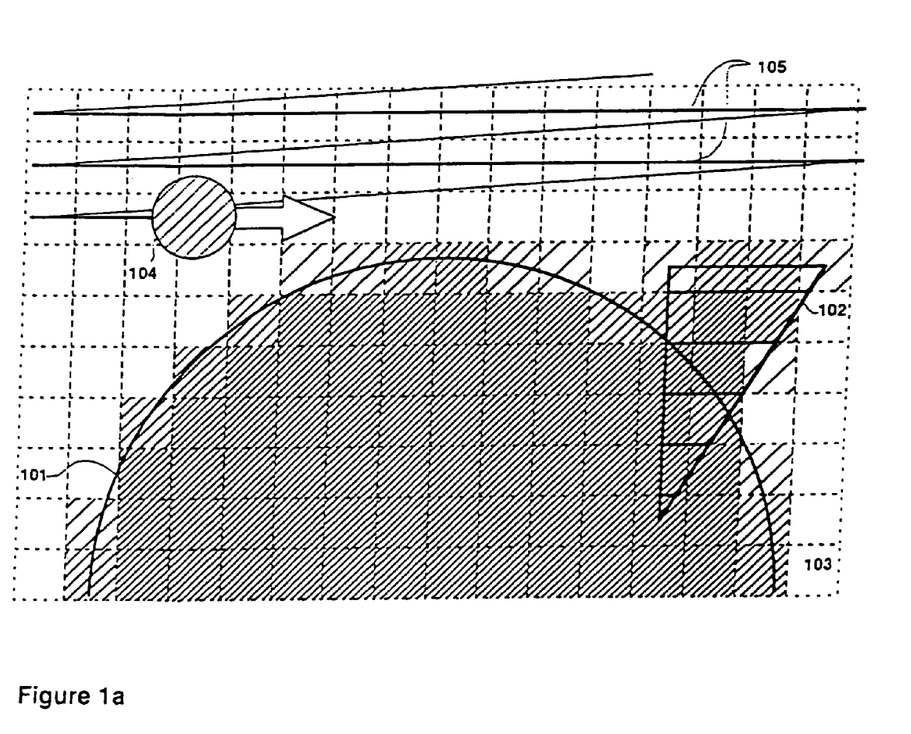
FIG. 1a shows how a round shape 101 combined with a triangular shape 102 are represented by a pixel map 103 with analog intensities (shown as varying shading). The beam 104 is scanning parallel lines 105. The size of the writing light spot is larger than a pixel, therefore the result on the plate will be smoothened to a round figure.
Figure 1B:
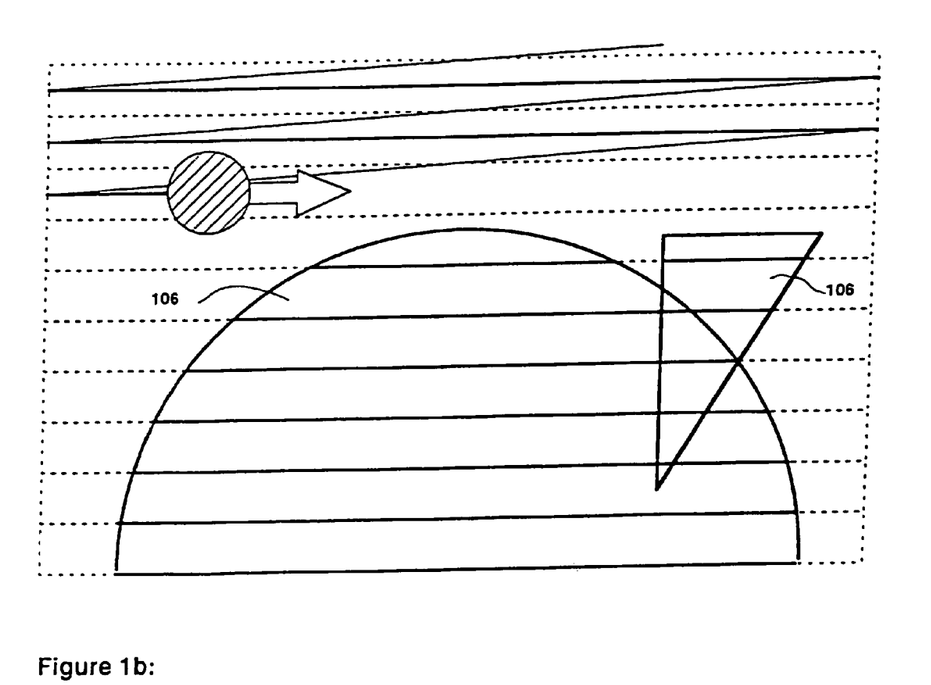
FIG. 1b shows the same shapes as in FIG. 1a, but where the geometrical shape are cut into segments 106 belonging to different scanlines.
Figure 1C:
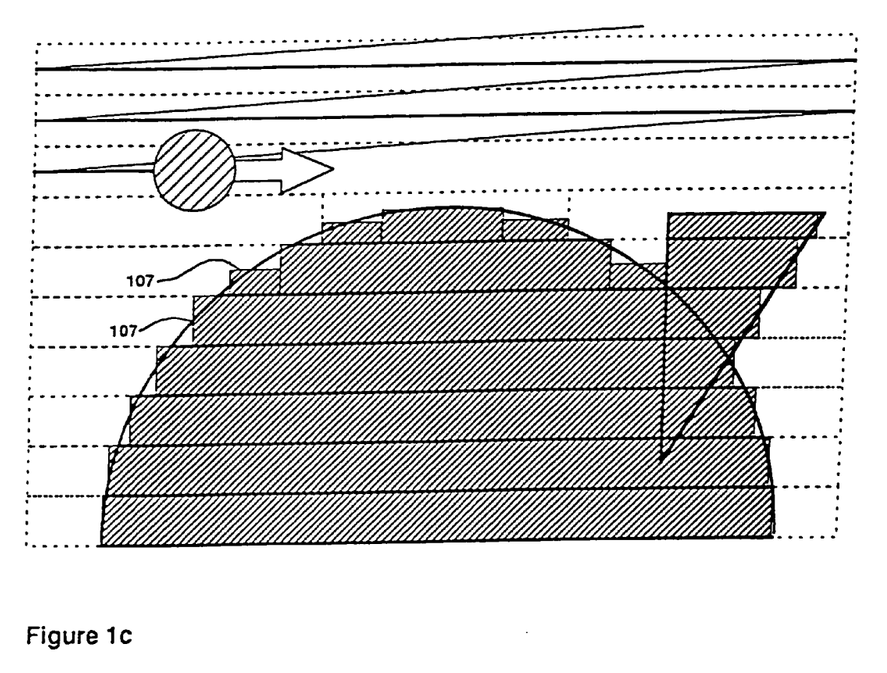
FIG. 1c shows the same shapes as in FIG. 1b, but where the segments are replaced by a simplified new segment 107, with only length and width. As in FIG. 1a the size of the spot will make the written figure smooth.
Figure 1D:
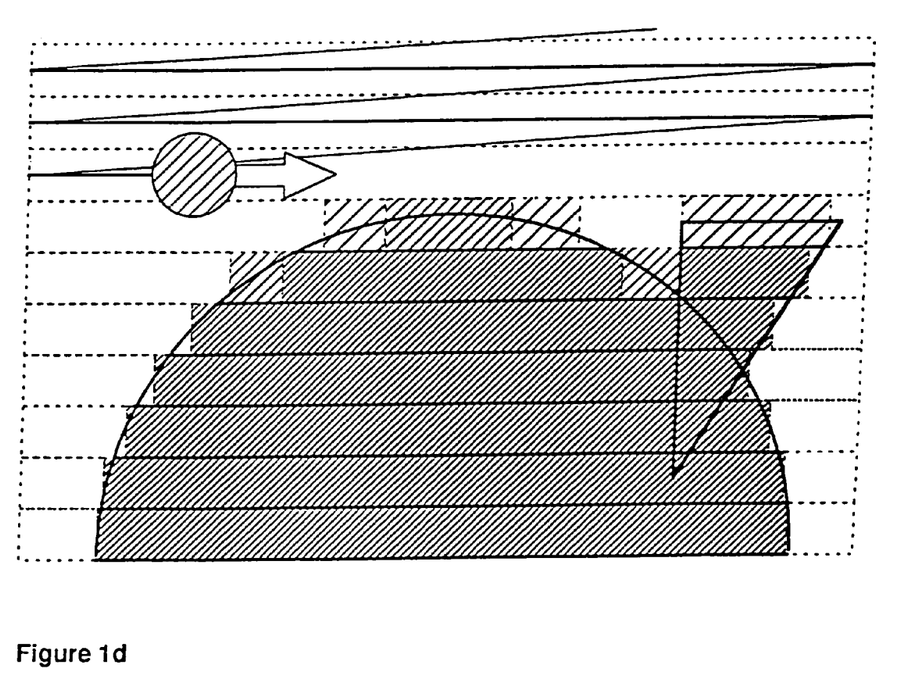
FIG. 1d shows the segments in FIG. 1c converted to analog values by the beam processor.
Figure 2:
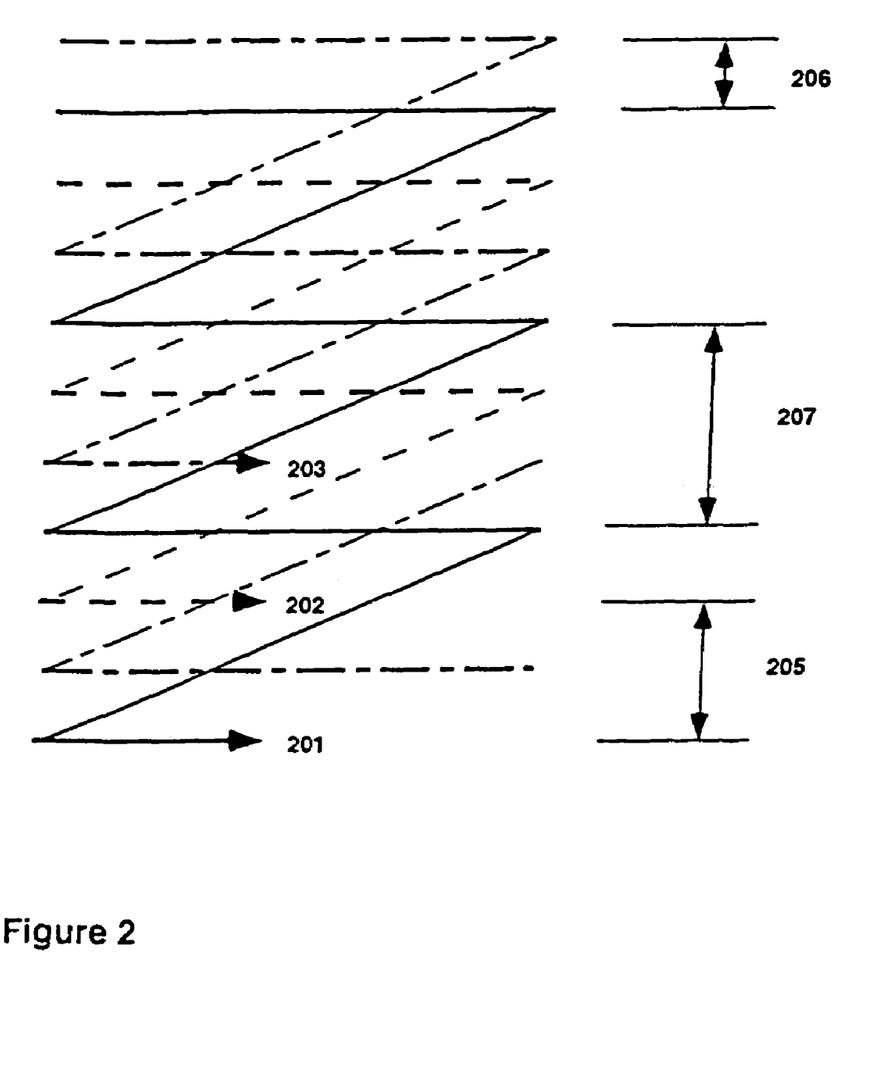
FIG. 2 shows three beams 201, 202, 203 forming interlaced scan lines with the spacing 206. The figure shows that the beams scan three lines and then retrace while the stage is advanced a distance 207 equal to three times the scan spacing. There are several possible spacings 205 between the beams, here two times the scan spacing 205 is shown.
Figure 3:
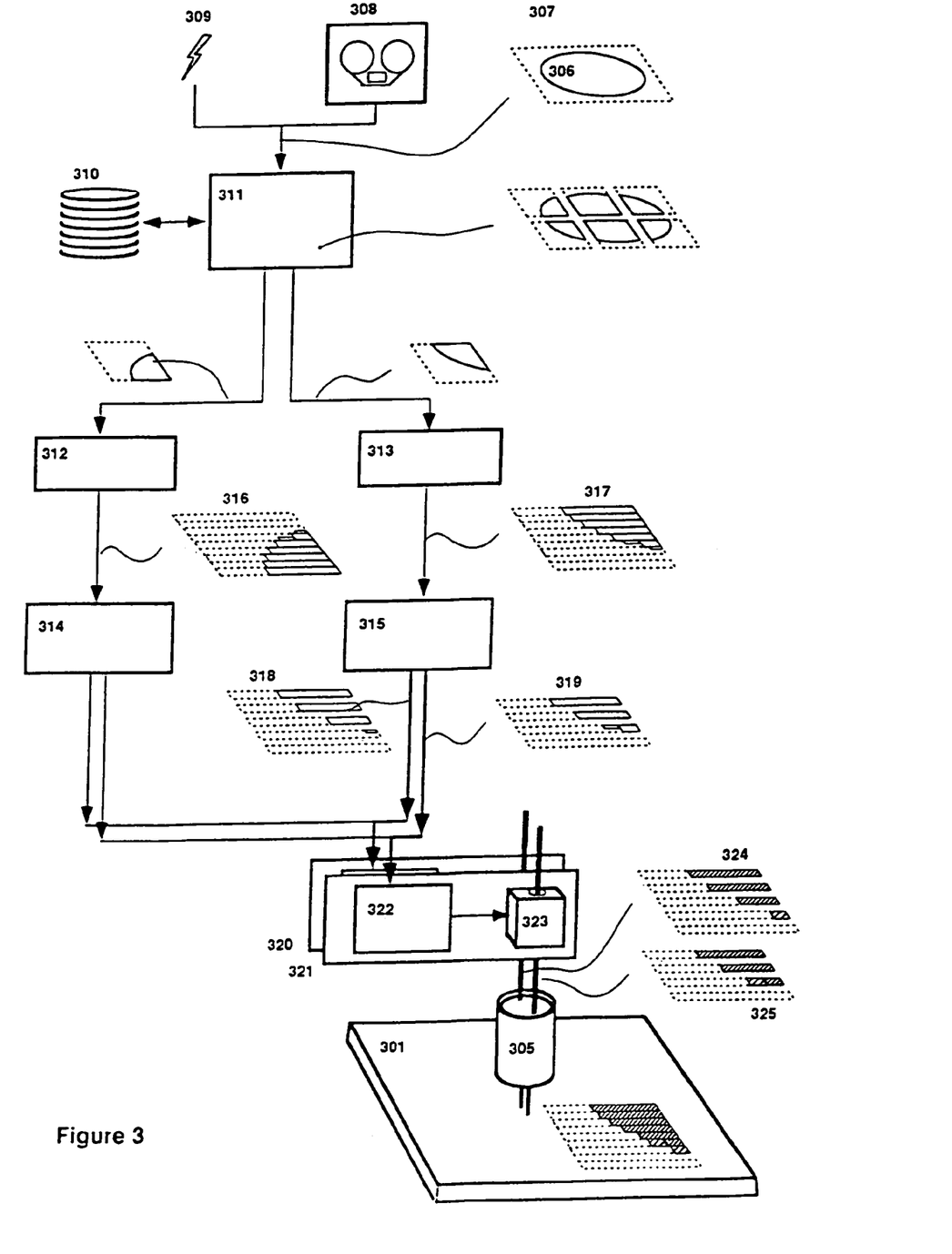
FIG. 3 shows a preferred embodiment of the invention with two beams and two segmentizers.

FIG. 3 shows an embodiment with two processors and two beams writing on a workpiece 301 using a demagnification and focusing lens 305. The scanning and advancement between the scans, not shown in this figure, can be done by the stage or the beams or by a combination of the two. The pattern, shown as a FIG. 306 in a square window 307, is described in the input data read from tape 308 or from a network 309. The input can be stored on local mass storage 310, e.g. on a local hard disk, by the host computer 311. The host computer sends the input data to the segmentizers 312, 313 after having performed any necessary format conversions, scalings, expansion of hierachical structures, etc. It may use mass storage 310 for intermediate storage at any time. Furthermore it cuts the data into fields that are suitable to the length of the scan lines and to the size of the data buffers in the data path. Depending on the complexity of the data a field can be chosen to be a full writing swath or part of a swath.

The host computer sends the data for each field to one of the segmentizers 312, 313, typically in the order they need to be written and to the first available segmentizer. The host computer maintains a table of where the data for each field is and its status.

The segmentizers cut the data to each scan line and forms a list of geometrical elements for each scan line and a list of scan lines 316, 317. Although the function of the invention does not depend on it, the segmentizer may simplify the geometries in each scan line, remove any overlapping geometries and form segments that are rectangles with length and width and sort both the lists of segments and the list of scan lines in order of use by the writing hardware.

The list of scan lines are sent to the interlace resolvers 314, 315 where the scan lines are separated depending on which beam they will be written by. New interlaced lists for each beam are assembled. In FIG. 3 the list 317 is split into the interlace lists 318 and 319 that are sent to beam processor units, e.g. beam processor boards 320, 321, each with a beam processor 322 and a modulator 323. In the beam processor boards the simplified geometry in the scan lists is resolved and converted to amplitude and time modulation of the laser beams. Since the beams are scanning the workpiece in parallel the interlaced patterns 324, 325 are reassembled in the exposed pattern.

Since only one field is written at a time only one interlace resolver can send data to the beam processors at a time as is shown by the heavy lines from 315 to 320, 321, unless the transfers are buffered so that the processing in the beam processors is decoupled from the datainput.

For a simple case with a small number of beams the distribution can be done by a multiplexor, i.e. a logic circuit that accepts a single input data stream from the segmentizer/segmentizers and directs data items to different outputs according to either their position in their stream or a tag in the data item.

FIG. 3 shows the method in schematic form and in a practical implementation details may vary, e.g. the two modulators can be a single physical device with two channels, each segmentizer can use one or several processors etc.

PREFERRED EMBODIMENTS

Figure 4A:
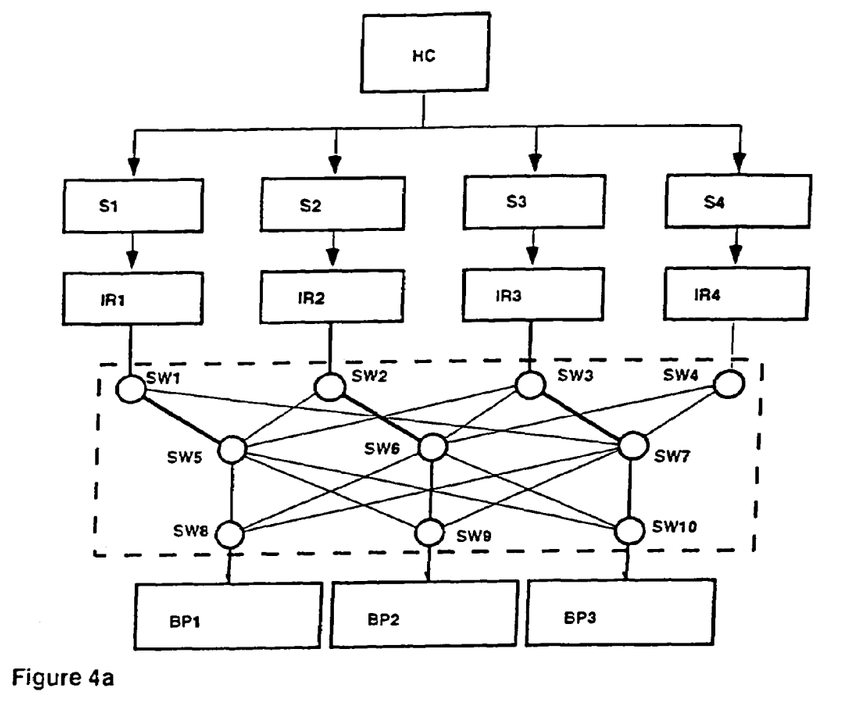
FIG. 4 shows a preferred embodiment with three beams and four segmentizers.
Figure 4B:
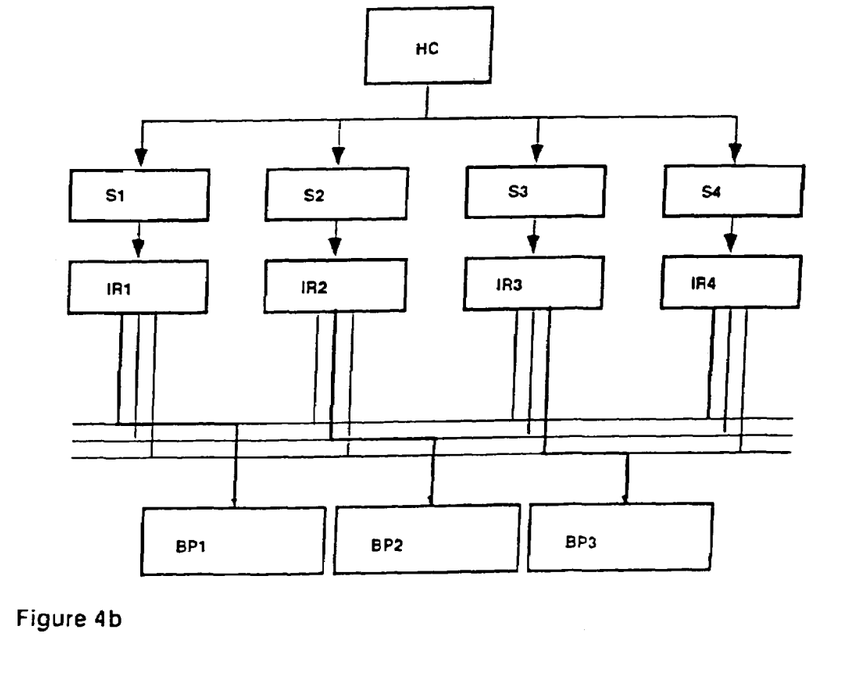

A preferred embodiment of the invention is in a three-beam laser writer for semiconductor reticles, as is shown in FIG. 4. The writer has a distance between the scan lines of 0.25 µm and a shortest segment length of 0.25 µm. The maximum conversion burst rate in the beam processors is 60 million segments per second and the system is writing approximately 60% of the total time. Accordingly the system writes 3*0.25 µm*0.25 µm*60%*60 million=6.75 sq.mm/s.

The data distribution network must be dimensioned for the worst possible case, i.e. the entire area filled with segments of minimum length, or else it is possible to supply an input data file that causes the system to malfunction due to data overload. Each beam processor has a maximum burst rate of 60 million segments per second and each segment is described by two data bytes. The three beam processors therefore have a maximum data consumption of 360 Mb/s, corresponding to 180–240 Mb/s maximum sustained average rate.

The links between the interlace resolvers and the beam processors are implemented as a cross-switch network of parallel links. Each link has a transfer rate of 180 Mb/s and the shown network can at any time support three simultaneous transfers. The throughput of the links between the segmentizers and the beam processors is 3×180 mb/s=540 Mb/s burst rate which is more than adequate for the worst possible pattern including overhead. Alternatively a simpler network can be used supporting two or only one transfer.

Figure 5:
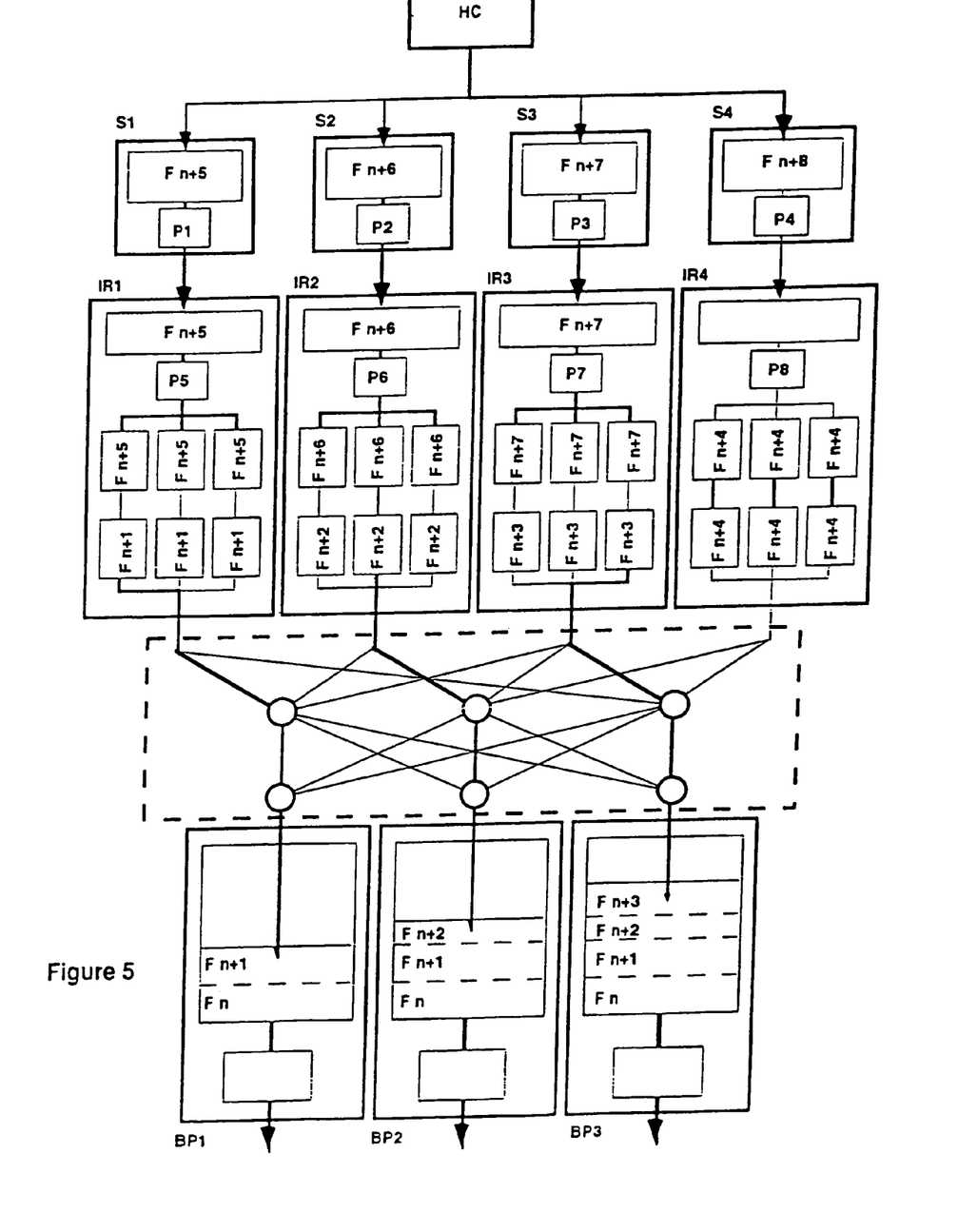
FIG. 5 shows how data is buffered to allow all components to run continuously at full capacity in another preferred embodiment with four segementisers and three beams.

FIG. 5 shows how generous buffers allow all components to work independent of all others. The heavy lines show current data transfers. The interlace resolvers (IR1–IR4) have two output buffers, one for storing new lists being worked on and one for storing the previous list waiting for transfer to the beam processors. Since the segmentizers are typically slower than the interlace resolvers the buffer memory between S and IR need not store any data, it needs only be large enough to allow S and IR to work in an asynchronous mode.

The beam processor units have FIFO buffers with room for several fields. Field n (Fn) is being written and is read from all FIFOs simultaneously, Fn+1 is transferred from IR1, while IR1 is working on Fn+5. IR2 and IR3 are one and two fields ahead of IR1, respectively, and the FIFOs of BP2 and BP3 are storing enough data to make the bottom of all FIFOs synchronized.

S4 and IR4 have just finished Fn+4 and IR4 is transferring the output from the work buffer to transfer buffer. At the same time the host computer HC is loading input data for a new field to S4. In actual operation the scheduling and transfer of data is more irregular than FIG. 5 leads one to believe, since the fields take different amounts of time to process and the scheduling is based on demand and availability. The buffer memories in FIG. 5 need not be physically separate but may be different areas in the same physical memory, and they may be reassigned dynamically. The processors P1 to P8 may likewise be 8 physical processors, but they may also be another number and they may be dynamically reassigned between different tasks.

FIG. 5 assumes that data needs to be loaded sequentially to the beam processor buffers. Using random-access writing instead of FIFOs would allow smaller buffer areas, but at the expense of more overhead and more complex management by the host computer. In the preferred embodiment FIFOs are used.

A real pattern will have a data requirement at least 4 times smaller than the maximum data rate or 45–67 Mb/s. A typical writing field is part of a swath 200 µm wide and 10 mm long needing an absolute maximum of 32 million segments or 64 Mb data, in practice not more than 8 million segments or 16 Mb data or 5.3 Mb per beam. 72 Mb buffer memory in the beam processor units (24 Mb in each unit) will then store several fields as shown in FIG. 5. An occasional field with too much data will cause the FIFO buffer to fill up and the pipelining will be lost for a couple fields, but the system will recover gracefully. With a larger number of processors than beams the writing hardware need only wait for data transfers, not for processing since the subsequent fields are already in the transfer buffers in the IRs.

The size of the fields can be changed dynamically, so that the field size is made smaller for extremely dense patterns and larger for less dense patterns.

Even in the case where the data to the beam processors are only rectangular non-overlapping segments, the conversion from geometrical elements to time and power in the beam processor uses a set of rules. First the geometry is converted to the hardware-supported time and power resolution. Secondly, the linearity between the power in the beam and the position of the edge is only approximate. When the beam is only slightly larger than the distance between two scan lines, the transient function is s-shaped and on some photo-sensitive materials there is an additional sag. Therefore it is advantageous to make an empirical calibration and store the calibration curve as a lookup table. Furthermore, if the geometrical linearity of the scan line is not perfect a stored geometrical correction table is useful.

The invention and embodiments satisfy the need for a real-time data conversion system for a wide range of applications, also the most demanding. In particular there is no hard limit to the number of processors that can be used in typical embodiments, since they use cross-switch network that is more easily extendible than bus systems. Systems designed according to the invention can also evolve with the rapidly increasing requirements on capacity. Since it is suitable to be built with standard processors, standard computer boards and software in portable high-level language, it can follow the technical development which has given a tripling of speed every two years in the past.

The terms and expressions which have been employed in the foregoing specification are used therein as terms of descritption and not of limitation, and there is no intention in the use of such terms and expressions of excluding equivalents of the features shown and descibed or portions thereof, it being recognized that the scope of the invention is defined and limited only by the claims which follow.

The invention claimed is:

1. A method for writing patterns on a light sensitive surface comprising the steps of:
   providing at least two modulated focused laser beams scanning the surface in interlaced parallel scan lines;
   providing for each beam a beam processor unit with data conversion logic and means for modulating said laser beam;
   providing input data containing geometries to be written on a plate in an input format;
   in a first conversion step fracturing the input data into writing fields including at least a portion of a writing swath;
   in a second conversion step cutting the geometries in a fractured database into scan lines, and generating for each scan line a scan list containing geometries to be written in the scan line, so called segments, and performing said second conversion step in at least two of the beam processor units, so called segmentizers, operating simultaneously but on different writing fields;
   further distributing said scan lists to the beam processor units in accordance with the interlacing of the scan lines; and
   in a third conversion step converting in said beam processor units said scan lists of segments to analog power modulation sequences for said laser beams.

2. A method as in claim 1 where in the segments in the scan lists are simplified geometrical representations of those parts of the input geometries that fall in the scan line.

3. A method as in claim 1 where in the segments in a scan lists are non-overlapping.

4. A method as in claim 1 where in the segments in a scan lists are rectangles with a length and a width.

5. A method as in claim 1 where in the segments in the scan lists are sorted in the order they will be written by the scanning beam.

6. A method as in claim 1 where in the conversion in the beam processor units uses a set of conversion rules that are empirically calibrated.

7. A method as in claim 1 where in the conversion in the beam processor units uses at least one table-lookup function.

8. A method as in claim 1 where in the scan lists are distributed to the beam processor units via a cross-switch network.

9. A method as in claim 1 where in the scan lists are distributed to the beam processor units via a bus-system.

10. A method as in claim 1 where in the scan lists are distributed to the any one of the preceding claims beam processor units by a multiplexer.

11. A method as in claim 1 where in the data are pipelined through the second and third conversion steps without intermediate non-volatile storage.

12. A method as in claim 1 where in beam boards has an input buffer with room for the scan lists for at least two writing fields.

13. A method as in claim 1 where the transfer between the segmentizers and the beam processor unit are double buffered, in one output buffer in the segmentizer and in one input buffer in the beam processor unit.

14. An apparatus for writing of patterns on a light sensitive surface comprising:
   at least two modulated focused laser beams scanning the surface in interlaced parallel scan lines;
   for each laser beam a beam processor unit with data conversion logic and means for modulating said laser beam;
   means for accepting input data containing geometries to be written on a plate in an input format;
   data processing means for in a first conversion step fracturing the input data into writing fields including at least a portion of a writing swath;
   parallel data processing means in the beam processor units for in a second conversion step cutting the geometries in a fractured database into scan lines, and generating for each scan line a scan list containing geometries to be written in the scan line, so called segments;
   data distribution means for distributing said scan lists to the beam processor units in accordance with the interlacing of the scan lines; and data conversion and beam modulation means in the beam processors units for, in a third conversion step, converting said scan lists of segments to analog power modulation sequences on said laser beams.

15. A method for writing of patterns on a light sensitive surface comprising:
providing at least two modulated focused laser beams scanning the surface in interlaced parallel scan lines;
providing for each beam a beam processor unit with data conversion logic and adapted to modulate the laser beam;
providing input data containing geometries to be written on a workpiece;
fracturing the input data into writing fields, including at least a portion of a writing swath, via a first conversion;
cutting the geometries in a fractured database into scan lines, and generating, for each scan line, a scan list containing geometries to be written in the scan line, via a second conversion, which is performed in at least two segmentizers, operating simultaneously but on different writing fields;
distributing the scan lists to the beam processor units in based on the interlacing of the scan lines; and
converting, in the beam processor units, the scan lists of segments into analog power modulation sequences for the laser beams, via a third conversion.

16. The method of claim 15, wherein segments in the scan lists are sorted in the order in which the segments will be written by the scanning beam.

17. The method of claim 15, wherein the data are pipelined through the second and third conversion steps without intermediate non-volatile storage.

18. The method of claim 15, wherein the transfer between the segmentizers and the beam processor unit is double buffered, one output buffer being located in the segmentizer and one input buffer being located in the beam processor unit.

19. An apparatus for writing of patterns on a light sensitive surface comprising:
at least two modulated focused laser beams scanning the surface in interlaced parallel scan lines;
for each laser beam an individual beam processor unit with data conversion logic and a modulator adapted to modulate the laser beam;
a processor adapted to accept input data containing geometries to be written on a workpiece, and adapted to fracture the input data into writing fields including at least a portion of a writing swath;
a segmentizer adapted to cut the geometries in a fractured database into scan lines, and adapted to generate, for each scan line, a scan list containing geometries to be written in the scan line; and
a resolver adapted to distribute the scan lists to each of the individual beam processor units based on the interlacing of the scan lines; wherein
the individual beam processors units are adapted to convert the scan lists into analog power modulation sequences on the laser beams.

* * * * *